United States Patent [19]

McCormack

[11] Patent Number: 5,153,524

[45] Date of Patent: Oct. 6, 1992

[54] TESTING ELECTROMAGNETIC SHIELDING EFFECTIVENESS OF SHIELDED ENCLOSURES

[75] Inventor: Ray G. McCormack, St. Joseph, Ill.

[73] Assignee: The United States of America as represented by the Secretary of the Army, Washington, D.C.

[21] Appl. No.: 330,247

[22] Filed: Mar. 29, 1989

[51] Int. Cl.⁵ ............................................ G01R 31/02
[52] U.S. Cl. ................................ 324/627; 174/35 MS
[58] Field of Search .................... 324/57 R, 539, 627; 174/35 MS

[56] References Cited

U.S. PATENT DOCUMENTS

| | | | |
|---|---|---|---|
| 3,142,143 | 2/1964 | Daniel | 324/57 R |
| 3,490,041 | 1/1970 | Shapiro et al. | 324/73 R |
| 3,492,568 | 1/1970 | Johnson | 324/57 R |
| 3,512,083 | 5/1970 | McCutcheon et al. | 324/57 R |
| 3,717,810 | 2/1973 | Spanbauer | 324/57 R |
| 3,952,245 | 4/1976 | Miller | 324/57 R |
| 4,054,786 | 10/1977 | Vincent | 324/77 A |
| 4,214,311 | 7/1980 | Nakashima et al. | 324/62 |
| 4,268,911 | 5/1981 | Bell | 365/104 |
| 4,463,309 | 7/1984 | Crochet et al. | 324/57 R |
| 4,467,283 | 8/1984 | Owen et al. | 324/357 |
| 4,510,572 | 4/1985 | Reece et al. | 324/73 AT |
| 4,524,444 | 6/1985 | Etron et al. | |

FOREIGN PATENT DOCUMENTS

| | | | |
|---|---|---|---|
| 0111465 | 7/1982 | Japan | 324/57 R |
| 0167232 | 7/1986 | Japan | 324/57 R |

OTHER PUBLICATIONS

Burns et al, "Rejection of Radio-Freqruency Noise with a Wide-Band Differential Preamplifier and Solid--Shielded Coaxial Input Cables", IEEE Trans. on Nuclear Science, vol. NS-23, No. 1, Feb. 1976.

Primary Examiner—Kenneth A. Wieder
Assistant Examiner—Maura K. Regan
Attorney, Agent, or Firm—Darrell E. Hollis

[57] ABSTRACT

A method for determining the electromagnetic RF shielding effectiveness of a shielding enclosure including sequentially driving the four diagonally opposite corner pairs of the enclosure with an RF signal, measuring the RF energy leakage for each corner pair, and averaging the four measured RF leakage levels to obtain an average RF energy leakage level. This average RF energy leakage level may then be compared with prior (preferably immediately after manufacture) measured average RF energy leakage levels to obtain an indication of the RF energy shielding effectiveness lost, if any, during the time from the prior test to the current test.

19 Claims, 4 Drawing Sheets

TESTING ELECTROMAGNETIC SHIELDING EFFECTIVENESS OF SHIELDED ENCLOSURES

STATEMENT OF GOVERNMENT INTEREST

The invention described and claimed herein may be manufactured and used by or for the Government of the United States of America for governmental purposes without the payment of royalties thereon or therefor.

BACKGROUND OF THE INVENTION

1. Field of the Invention

This invention relates to a method and apparatus for measuring the radio frequency (RF) energy leakage of shielded enclosures.

2. Description of the Prior Art

In testing RF or other sensitive electronic equipment, it is often necessary to make tests within a room shielded against RF signals to prevent extraneous signals from interfering with the test measurements being made. In addition, RF shielded enclosures are provided as cabinets for RF transmitters and receivers. Such shielding is necessary in order to prevent radiation of extraneous RF signals generated within the cabinet in the case of electronic equipment which radiates electromagnetic energy and to prevent extraneous RF signals or noise from outside the enclosure from disrupting or interfering wiyh normal operation of sensitive electronic equipment. Shielded rooms are also necessary to prevent compromising emanations from data processing equipment which is processing information important to national security.

Seam Leak Detectors (SLDs), such as the one described in U.S. Pat. No. 3,492,568 to Johnson, have been commercially available for several years. These SLDs use two major components, an RF current source and a hand-held receiver with an antenna probe. To operate the SLD, the RF current source is connected to a pair of diagonally opposite corners of a shielding enclosure by means of long wires and large spring loaded clips.

The current from the RF current source spreads over the enclosure in a complex manner. At the seams, or other leakage points, electromagnetic fields are developed inside the enclosure either from leakage directly through slits or apertures or from voltage developed across the electrical resistance of the seams. In the case of thin shields, some RF energy may diffuse through the shield.

The fields inside the enclosure are detected by the hand-held receiver. It is generally recommended that the measurements be repeated while applying the RF current signal to a second pair of diagonally opposite corners. Typically, the SLD's receiver provides a meter reading in decibels relative to an arbitrary value with the receiver gain being adjustable and an attenuator provided to assure a wide dynamic range of measurement.

Such prior art SLDs suffer from inaccurate measurements due to the uneven current distribution from the SLD RF current sources over the shielded room surfaces or from electrical null effects that exists for each pair of diagonally opposite corners. In addition, the measurements are absolute because prior measurements made on the enclosure are not available for comparison with present measurements. Accordingly, it is impossible to measure the amount of degradation in or loss of shielding effectiveness resulting from use of the enclosure. Also, such devices do not provide a quantitative measurement of the effectiveness of a shield for attenuating RF energy that compares favorably with the methods described by MIL-STD-285.

SUMMARY OF THE INVENTION

To overcome these problems, among others, the present invention provides a method and apparatus by which SLD measurements are repeated for each of the four possible sets of diagonally opposite corners of a shielding enclosure, with the receiver gain held constant. A multiplexing RF current source is provided to sequentially apply the RF current signal to the four sets of diagonally opposite corners. The measured RF energy levels of all four corner pairs are averaged to obtain an average RF energy leakage measurement. This average RF energy leakage measurement is then compared with a prior (preferably immediately after manufacture) average RF energy leakage measurement to determine the loss of shielding effectiveness occurring since the prior measurement. In addition, the average RF energy leakage measurement indicates whether or not continued use of the shielding enclosure is acceptable for its intended purpose. A read only memory (ROM), associated with the enclosure, is provided for storing the baseline shielding data from the initial test or other data made prior to the present measurements for comparison purposes.

DETAILED DESCRIPTION OF THE PREFERRED EMBODIMENTS

Figure 1:
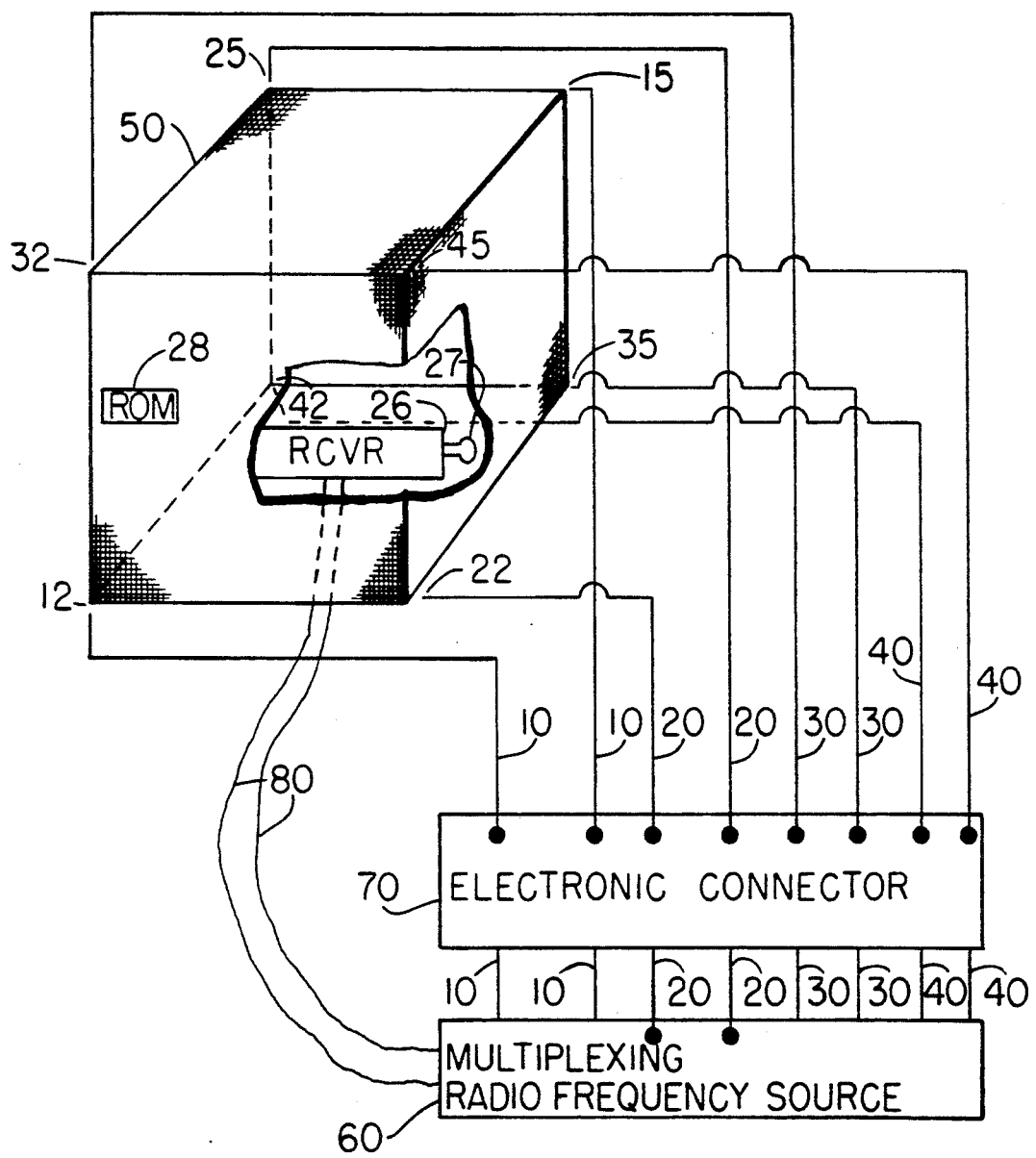
FIG. 1 is a perspective and schematic view of one embodiment of the present invention.

Referring to FIG. 1 a first embodiment of the invention is illustrated. A multiplexing radio frequency source 60 sequentially switches a radio frequency (RF) signal onto output wire pairs 10, 20, 30 and 40. The wire pairs 10, 20, 30 and 40 after passing through electrical connector 70 are connected to opposite corners on the exterior of shielded enclosure 50. Spring loaded clips or other attachment means may be provided on the attachment end of each wire of the wire pairs 10, 20, 30 and 40 for connecting each wire to its proper enclosure corner. Wire pair 10 is connected to opposite corners 12 and 15. Wire pair 20 is connected to opposite corners 22 and 25. Wire pair 30 is connected to opposite corners 32 and 35. Wire pair 40 is connected to opposite corners 42 and 45.

Connector 70 allows the four wire pairs 10, 20, 30 and 40 from multiplexing RF source 60 to be quickly and easily connected to the four wire pairs 10, 20, 30 and 40 which attach to the enclosure corners.

A RF receiver 26, having an antenna 27, is positioned at a designated test point or points within shielded enclosure 50 for measuring the radio frequency energy leaking through the enclosure. Typically, the test points are designated at intervals along the interior seams of shielded enclosure 50, although test points may be designated anywhere within enclosure 50. RF receiver 26 takes measurements at each designated test point.

The measurements made by RF receiver 26 at any one test point measure the average RF energy present at any one selected test point from the sequential driving of wire pairs 10, 20, 30 and 40 with the RF signal. RF receiver 26 detects the amount of RF energy leakage at one specified test point first during the time period the RF signal on wire pair 10 is applied to corners 12 and 15. Next RF receiver 26 detects the amount of RF energy leakage at the same specified test point during the time period the RF signal on wire pair 20 is applied to corners 22 and 25. Next, RF receiver 26 detects the amount of RF energy leakage at the same specified test point during the time period the RF signal on wire pair 30 is applied to corners 32 and 35. Finally, RF receiver 26 detects the amount of RF energy leakage at the same specified test point during the time period the RF signal on wire pair 40 is applied to corners 42 and 45. Once these four RF energy leakage levels are measured and stored, RF receiver 26 averages them to obtain a measure of the average RF energy leakage for the designated test point or with an appropriate multiplexing rate, the receiver read-out meter will average the four values due to its mechanical time constant. Of course, if more than one designated test point is specified for testing, then RF receiver 26 provides a measure of the average RF energy leakage for each designated test point separately.

The sequential switching rate of multiplexing RF source 60 is selected so as to match the time constants of RF receiver 26 in order that meaningful measurements may be made. In addition, the gain of RF receiver 26 is held substantially constant for each of the four measurements made for each designated test point.

It has been found that by using the RF energy leakage measurement method described above that the average RF energy leakage measurement compares favorably with RF shielding measurements made by the method specified by MIL-STD-285. Accordingly, the RF energy leakage measurement method described above may be used in place of the methods specified by MIL-STD-285 to obtain repeatable RF shielding measurements for a shielded enclosure.

By way of example, the frequency of the RF signal provided by multiplexing RF source 60 may be between 70 and 150 kilocycles. Of course, other higher and lower frequency signals may be used. In addition, a single predetermined minimum acceptable average RF energy leakage level or a range of such levels may be set for each test point. If the measured average RF energy leakage value exceeds this predetermined level or range of levels the shielded enclosure is unacceptable.

Shielded enclosure 50 may be initially tested after manufacture and the average RF energy leakage level for each designated test point measured. The initial measured average RF energy leakage level and the location of the designated test point where the measurement was made may be stored in ROM 28 for each designated test point along with the gain setting for RF receiver 26. Subsequently, the data stored in ROM 28 may be read out of ROM 28 into a microprocessor or other appropriate electronic circuits associated with RF receiver 26 and the average RF energy leakage levels subsequently measured for each test point by RF receiver 26 may be compared with the initial data contained in ROM 28. This comparison provides a measure of the degradation in RF shielding, if any, occurring from use of enclosure 50. A flow chart from which a computer program may be written to make such a comparison is shown in FIG. 2. ROM 28 may be permanently or removably attached to shielded enclosure 50, if desired. In addition, minimum acceptable deviations in leakage levels for each test point may also be programed into the microprocessor and an indicator or an alarm may be actuated when this minimum acceptable deviation is exceeded. For example, assume an initial leakage level A was measured and stored in ROM 28 along with a minimum deviation C for test point 1. Subsequently, a leakage level B was measured for test point 1. If B-A is equal to or greater than C, then the minimum deviation has been exceeded and an indicator or an alarm may be actuated to alert personnel. In addition, if a plurality of test points are designated, an average of the average leakage measurements for all the designated test points may be made and then compared with an initial average of the average leakage measurements and this comparison compared with a minimum deviation.

A wire pair 80 may be provided from receiver 26 to RF source 26 for synchronizing the operation of the RF source 60 with the operation of receiver 26. By providing wire pair 80 the operator can place receiver 26 at a designated test point and then remotely signal RF source 60 to sequentially apply the RF signal to each of the four enclosure corner pairs. Otherwise, the source 60 must be actuated from outside enclosure 50. Proper shielding of wire pair 80 at the point of penetration of enclosure 50 may be provided to prevent leakage of the applied RF signal at the point of penetration.

Figure 2A:
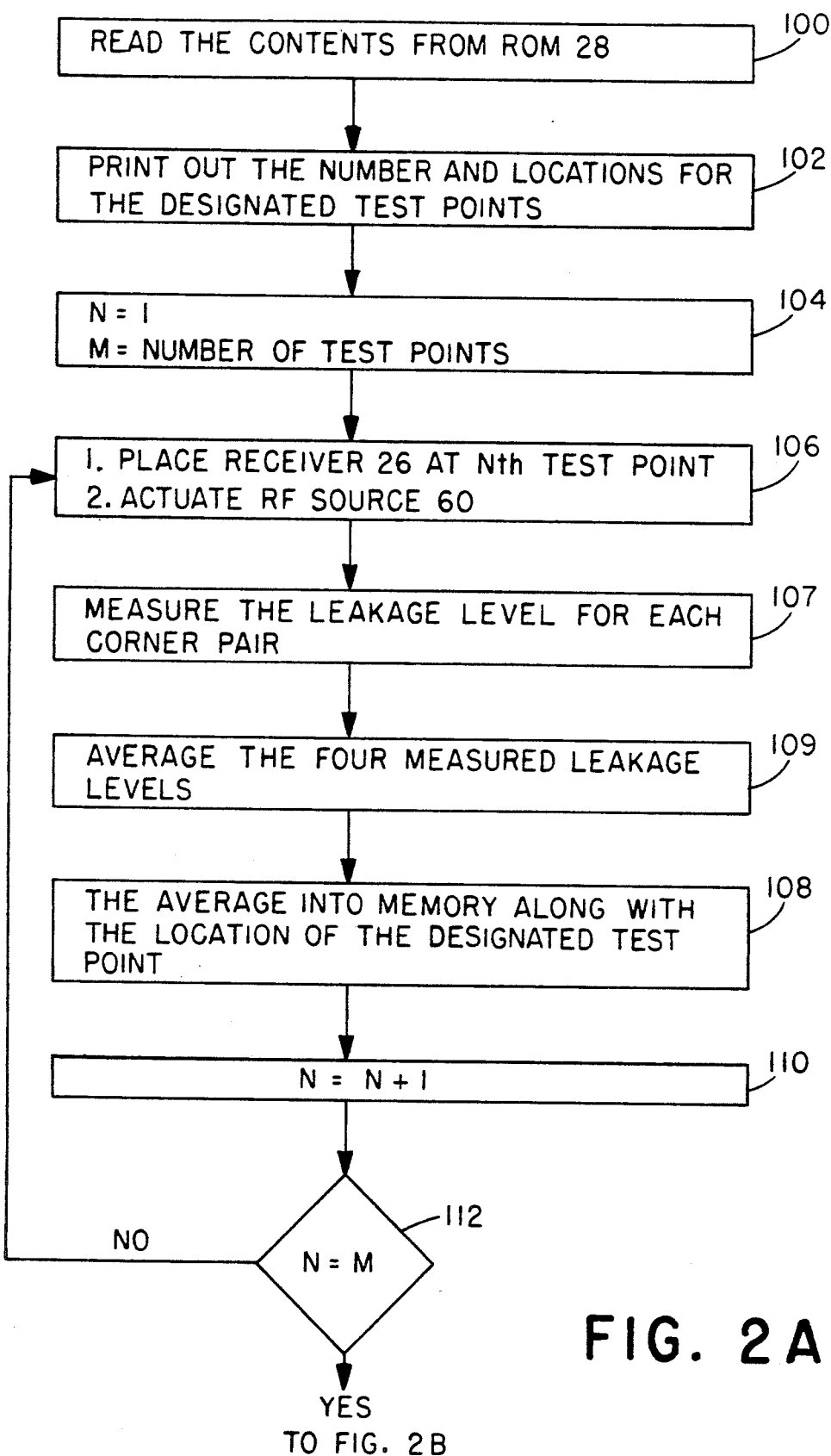
FIGS. 2a and 2b comprise a flow chart.
Figure 2B:
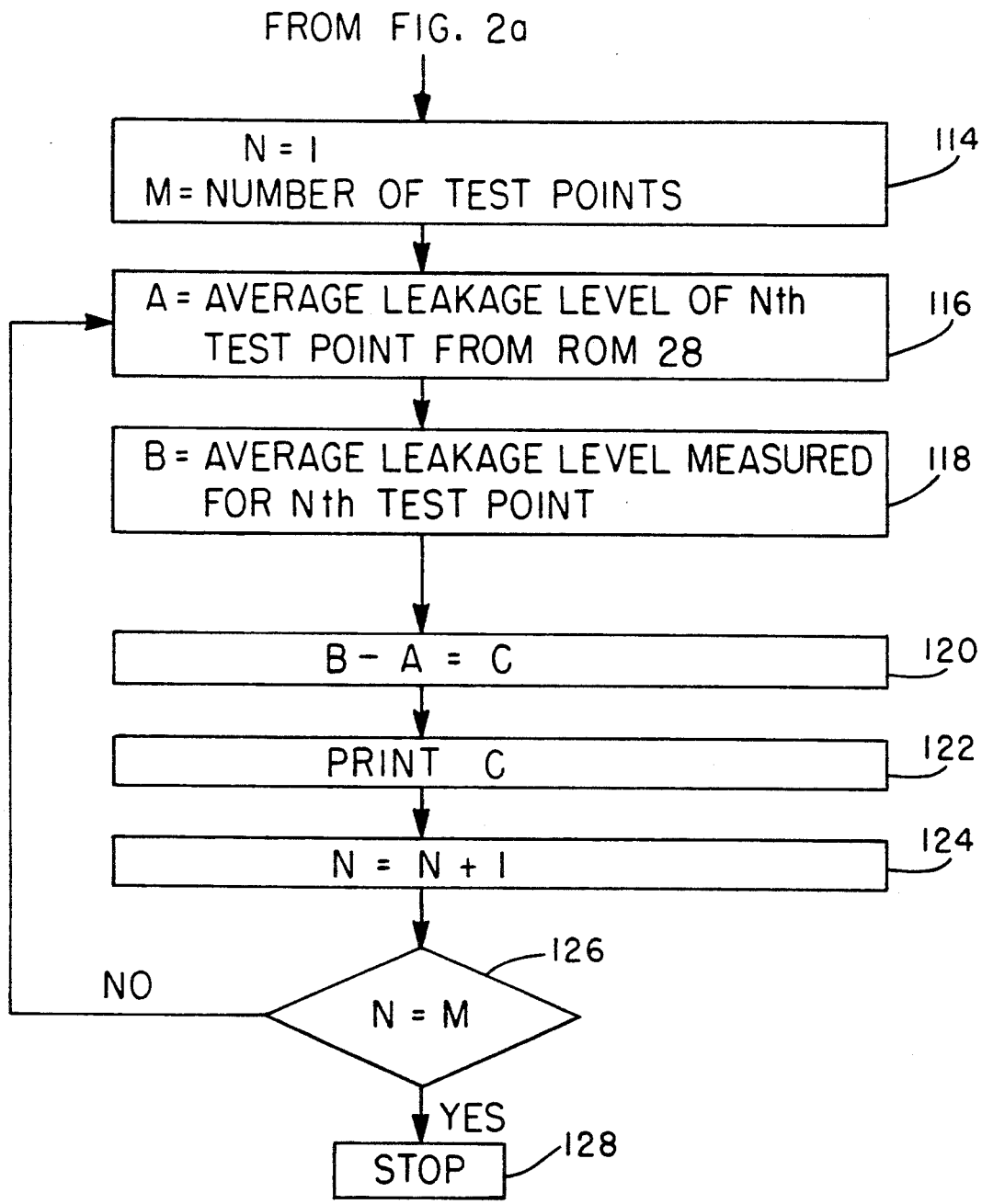

Turning to FIGS. 2a and 2b, a flow chart from which a computer program may be written is illustrated. The contents of ROM 28, indicating the number and location of the designated test points, are read out and stored in the microprocessor associated with receiver 26 as indicated by box 100. Next, the location and number of designated test points are printed out as indicated by box 102 so that the operator knows where to position the receiver 26. Box 104 sets the number of test points M and, therefore, the number of iterations M to be made in testing the enclosure. Also, the designated test point currently under test N is initially set to 1. Box 106 is drawn with a broken line to indicate the manual operations of placing the receiver 26 at the designated test point currently being tested and to activate the source 60. As discussed above, the source 60 may be remotely activated from the receiver 26 via a signal over wire pair 80. Box 107 provides for measuring the four leakage levels resulting from applying the RF signal to each diagonally opposite corner pair. Box 109 provides for averaging these four measured leakage levels to obtain a average leakage level for the designated test point. Box 108 provides for writing this average leakage level in to memory along with the location of the designated test point. Box 110 adds 1 to the test point currently being tested N to advance the microprocessor to the next designated test point. Decision box 112 continues the loop or iterations until measurements for the last designated test point are made and the average stored in memory. Box 114 provides initialization of the parameters M and N for the next iteration or loop. Box 116 provides for reading out of memory the average leakage level of the Nth test point that was stored in ROM 28 and setting that value equal to A. Box 118 provides for reading out of memory the average leakage level measured for the Nth test point and setting that value equal to B. Box 120 provides comparing B with a by subtracting B from A and setting that value equal to C. Box 122 provides for printing out C. Box 122 provides for incrementing N for the next loop or iteration and decision box 126 provides for detecting the processing of all the average leakage levels measured for the designated test points.

Figure 3:
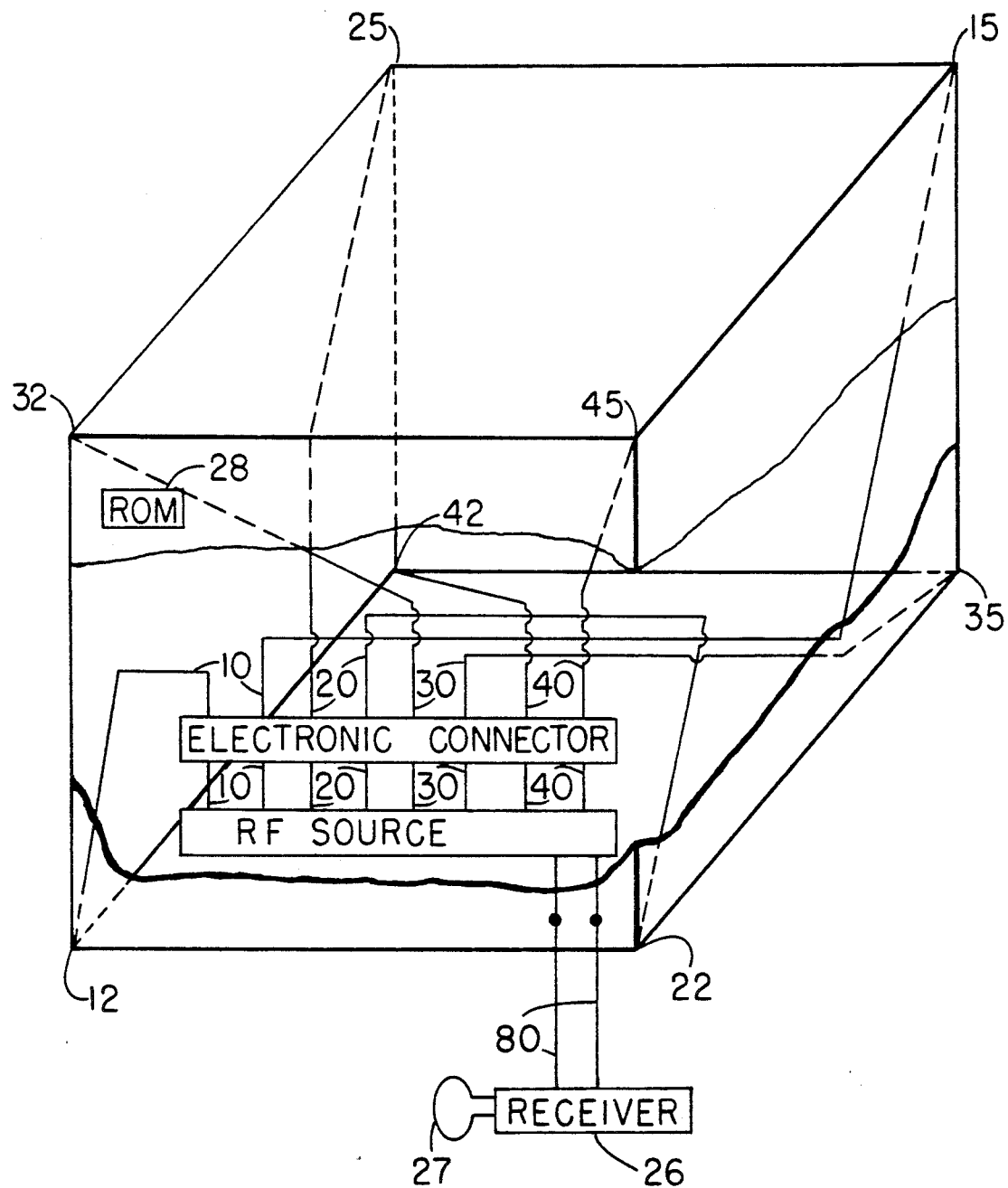
FIG. 3 is a perspective and schematic view of a second embodiment of the present invention.

Now turning to FIG. 3 a second embodiment is illustrated. This second embodiment is particularly suitable for measuring the shielding effectiveness of shielded enclosures used to house and protect electronic equipment. This equipment is usually rack mounted very close the enclosure walls thereby preventing easy access to the designated test points inside the enclosure. To solve this problem the RF signal source 60 and wire pairs 10, 20, 30 and 40 are placed inside shielded enclosure 50. The wire pairs 10, 20, 30 and 40 are attached to the interior corners of enclosure 50 in the same manner and configuration as the embodiment shown in FIG. 1.

The receiver 26 is now located outside enclosure 50 as are the designated test points. Here again wire pair 80 is provided between receiver 26 and RF signal source 60 for synchronizing the operation in the same manner as discussed above with respect to the embodiment shown in FIG. 1.

The embodiment of FIG. 3 is used for measuring RF leakage in the same general manner as the embodiment of FIG. 1, the only difference being that the RF signal is applied to the inside of enclosure 50 rather than the outside, with the receiver 26 being outside enclosure 50.

It is understood that the invention can be practiced other than as is specifically described above.

I claim:

1. A method for measuring the electromagnetic RF leakage levels for a shielded enclosure, comprising the steps of:
   a. sequentially applying an RF current signal to diagonally opposite corner pairs of the shielding enclosure through connections made to more than one said corner pairs;
   b. measuring the electromagnetic RF energy leakage level for each corner pair; and
   c. automatically averaging the measured RF leakage levels to obtain an average RF energy leakage level for the enclosure.

2. The method of claim 1 further including the steps of
   a. providing data representative of the average RF energy leakage level for the enclosure obtained from prior measurements; and
   b. comparing the prior measured average RF energy leakage level data with the current measured average RF energy leakage level to obtain a measure of the loss of shielding effectiveness that occurred during use of the enclosure.

3. The method of claim 1 wherein
   a. the RF current signals are sequentially applied to the corner pairs on the inside of the enclosure; and
   b. the RF leakage levels are measured outside the enclosure.

4. The method of claim 1 wherein
   a. the RF current signals are sequentially applied to the corner pairs on the outside of the enclosure; and
   b. the RF leakage levels are measured inside the enclosure.

5. The method of claim 1 further including repeating steps a.-c. for each of a plurality of designated points adjacent the enclosure.

6. An apparatus for measuring the shielding effectiveness of a shielding enclosure, comprising:
   a. a plurality of wire pairs with each said wire pair being coupled to diagonally opposite inside corners of the enclosure;
   b. a multiplexing RF current source communicating with said plurality of wire pairs for sequentially applying a RF current signal to each said wire pair;
   c. a RF receiver positioned at a designated location outside the enclosure;
   d. a memory, associated with the enclosure, for storing leakage data made from prior leakage measurements; and
   e. means for comparing the leakage data from said memory with leakage measurements subsequently made.

7. The apparatus of claim 6 wherein the comparing means includes a microprocessor associated with said receiver.

8. An apparatus for measuring the shielding effectiveness of a shielding enclosure, comprising:
   a. a plurality of wire pairs with each wire pair being coupled to diagonally opposite outside corners of the enclosure;
   b. a multiplexing RF current source communicating with said plurality of wire pairs for sequentially applying a RF current signal to each said wire pair;
   c. a RF receiver positioned at a designated location inside the enclosure;
   d. a memory associated with the enclosure for storing leakage data made from prior leakage measurements; and
   e. means for comparing the leakage data from said memory with leakage measurements subsequently made.

9. The apparatus of claim 8 wherein the comparing means includes a microprocessor associated with said receiver.

10. An apparatus for measuring the shielding effectiveness of a shielding enclosure, comprising:
    a. a plurality of wire pairs with each said wire pair being coupled to diagonally opposite inside corners of the enclosure;
    b. a multiplexing RF current source communicating with said plurality of wire pairs for sequentially applying a RF current signal to each wire pair;
    c. a RF receiver positioned at a designated location outside the enclosure;
    d. a ROM, associated with the enclosure, for storing leakage data made from prior leakage measurements; and,
    e. means for comparing the leakage data from said ROM with leakage measurements subsequently made.

11. The apparatus of claim 10 wherein the comparing means includes a microprocessor associated with said receiver.

12. An apparatus for measuring the shielding effectiveness of a shielding enclosure, comprising:
    a. a plurality of wire pairs with each said wire pair being coupled to diagonally opposite inside corners of the enclosure;
    b. a multiplexing RF current source communicating with said plurality of wire pairs for sequentially applying a RF current signal to each wire pair;
    c. a RF receiver positioned at a designated location inside the enclosure;
    d. a ROM, associated with the enclosure, for storing leakage data made from prior leakage measurements; and, e. means for comparing the leakage data from said ROM with leakage measurements subsequently made.

13. The apparatus of claim 12 wherein the comparing means includes a microprocessor associated with said receiver.

14. An apparatus for measuring the shielding effectiveness of a shielding enclosure, comprising:
   a. a plurality of wire pairs with each said wire pair being connected to diagonally opposite inside corners of the enclosure, such that said wire pairs are connected to more than one said diagonally opposite corners;
   b. a multiplexing RF current source communicating with said plurality of wire pairs for sequentially applying a RF current signal to each said wire pair;
   c. a RF receiver positioned at a designated location outside the enclosure for measuring RF leakage levels; and
   d. means for automatically averaging the measured RF leakage levels to obtain an average RF energy leakage level for the enclosure.

15. The apparatus of claim 14 further comprising;
   a. a memory, associated with the enclosure, for storing leakage data made from prior leakage measurements; and
   b. means for comparing the leakage data from said memory with leakage measurements subsequently made.

16. The apparatus of claim 15 wherein the comparing means includes a microprocessor associated with said receiver.

17. An apparatus for measuring the shielding effectiveness of a shielding enclosure, comprising:
   a. a plurality of wire pairs with each wire pair being connected to diagonally opposite outside corners of the enclosure, such that said wire pairs are connected to more than one said diagonally opposite corners;
   b. a multiplexing RF current source communicating with said plurality of wire pairs for sequentially applying a RF current signal to each said wire pair;
   c. a RF receiver positioned at a designated location inside the enclosure for measuring RF leakage levels; and
   d. means for automatically averaging the measured RF leakage levels to obtain an average RF energy leakage level for the enclosure.

18. The apparatus of claim 17 further comprising:
   a. a memory associated with the enclosure for storing leakage data made from prior leakage measurements; and
   b. means for comparing the leakage data from said memory with leakage measurements subsequently made.

19. The apparatus of claim 18 wherein the comparing means includes a microprocessor associated with said receiver.

* * * * *